United States Patent [19]

Donaher et al.

[11] 4,312,555

[45] Jan. 26, 1982

[54] RECEPTACLE FOR STACKING ELECTRONIC PACKAGES

[75] Inventors: Charles J. Donaher, Los Altos Hills; Gordon D. Christensen, San Jose, both of Calif.

[73] Assignee: Thomas & Betts Corporation, Raritan, N.J.

[21] Appl. No.: 85,767

[22] Filed: Oct. 17, 1979

[51] Int. Cl.³ .......................................... H01R 13/54
[52] U.S. Cl. .......................... 339/75 MP; 339/17 CF
[58] Field of Search ........... 339/17 CF, 75 R, 75 MP, 339/75 M, 74 R

[56] References Cited

U.S. PATENT DOCUMENTS

| | | | |
|---|---|---|---|
| 3,951,495 | 4/1976 | Donaher et al. | 339/17 CF |
| 4,018,494 | 4/1977 | Scheingold et al. | 339/17 CF |
| 4,045,105 | 8/1977 | Lee et al. | 339/17 CF |
| 4,080,026 | 3/1978 | Gianni | 339/17 CF |
| 4,116,519 | 9/1978 | Grabbe et al. | 339/17 CF |
| 4,189,199 | 2/1980 | Grau | 339/75 MP |
| 4,266,840 | 5/1981 | Seidler | 339/75 M |

Primary Examiner—Joseph H. McGlynn
Assistant Examiner—Frank H. McKenzie, Jr.
Attorney, Agent, or Firm—Robert M. Rodrick; Jesse Woldman

[57] ABSTRACT

A receptacle for stacked support of electronic packages provides ready address/selection of each package by disposing vertically spaced receptacle contact sets in offset relation longitudinally of an elongate package-receiving channel. Package stacking is facilitated by a fixed support for a lower package and a further support selectively movable into the package-receiving channel for supporting an upper package. Zero insertion force is provided by an actuator operable to displace receptacle contact sets from noninterfering disposition with respect to the channel into engagement with package contacts.

29 Claims, 19 Drawing Figures

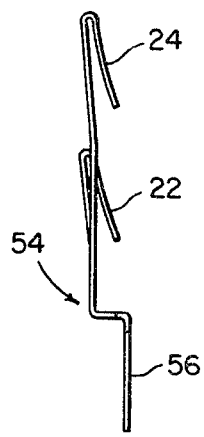 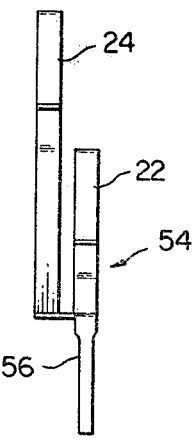 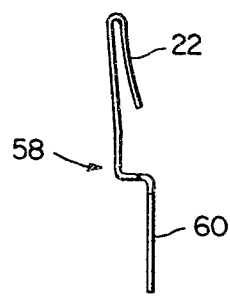 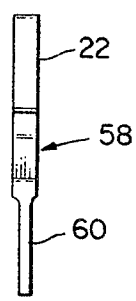
FIG. 2(a)　　FIG. 2(b)　　FIG. 2(c)　　FIG. 2(d)
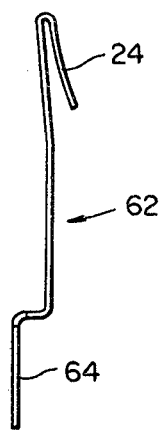 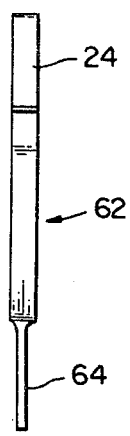
FIG. 2(e)　　FIG. 2(f)
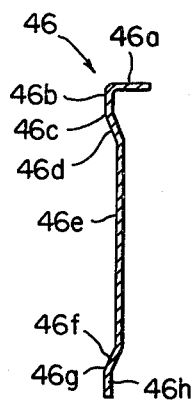 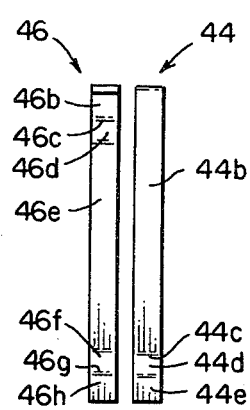 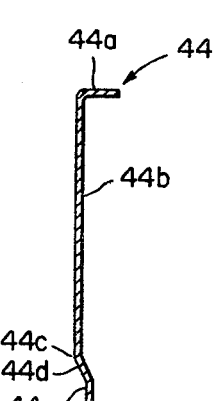
FIG. 3(a)　　FIG. 3(b)　　FIG. 3(c)

RECEPTACLE FOR STACKING ELECTRONIC PACKAGES

FIELD OF THE INVENTION

This invention relates generally to electrical connectors and pertains more particularly to receptacles for interconnecting plural electronic packages with support substrates.

BACKGROUND OF THE INVENTION

In recent years, the electronics industry has looked increasingly to so-called "stacking" of chip carriers and the like to meet information density requirements. Such practice, wherein plural packages overlie common printed circuit board (PCB) real estate, provides a doubling or more of information density, for example, memory capability.

Known efforts in this area have looked to the stacking of chip carriers and dual-in-line packages (DIP) and have provided receptacles having contacts insertable in PCB apertures for soldering thereto and extending upwardly from the PCB to frictionally receive and engage contacts of packages inserted into the receptacles.

Where it is desired to employ the stacked packages electrically independently of one another, the art has looked to several measures for separately addressing the packages. Typically, the contacts of the stacked packages are vertically aligned and circuit paths to the PCB may be redundant to the stacked packages for contacts thereof not involved in package selection. Thus, a single receptacle contact may engage vertically successive package contacts. On the other hand, a unique circuit path is required from the PCB to each package contact providing selection or activation of a package. In one known approach, receptacle contacts are provided with break-away portions, whereby one may interrupt continuity from the PCB to an upper package contact or a lower package contact, despite vertical alignment thereof. In another known approach, package selection contacts are led from the receptacle off-board and are thus not available at the PCB as are all other package contacts. In still another approach, packages are customized to provide for vertically unaligned select/address contacts.

While stacking presents little user difficulty where the stacked packages are used electrically dependently in parallel circuit relation to the PCB, user difficulty is seen in the alternative situation wherein vertical address/select differentiation is required. In the first known approach discussed above, bypassing of one of two vertically aligned package contacts presents a problem in later accessing such bypassed contact from the PCB. Thus, one need define another usable circuit path, for example, from the bypassed package contact to an unused package contact and thence to the PCB through a receptacle contact servicing the unused package contact. In the second discussed approach, the off-board disposition of address/select package contacts precludes accessing from the PCB. The last noted approach requires the tailoring of package contact layout to the receptacle contacts and accordingly does not lend itself to standardization permitting commercial package substitution. Finally, all of the known approaches adopt frictional contact interfitting and do not meet zero insertion force applications.

The above and related approaches are more specifically identified in the statement filed herein pursuant to 37CFR 1.97 and 1.98.

SUMMARY OF THE INVENTION

It is an object of the present invention to provide improved receptacles for interconnecting plural electronic packages to PCB and like support substrates with package address/select capability.

It is a more particular object of the invention to provide a stacking receptacle of zero insertion force type.

DESCRIPTION OF THE DRAWINGS

FIGS. 2(a)-2(f) are side and front elevations of diverse receptacle contact configurations for the FIG. 1 receptacle.

FIGS. 3(a)-3(c) are side and front elevations of contact actuators of the FIG. 1 receptacle.

DESCRIPTION OF THE PREFERRED EMBODIMENT

Figure 1:
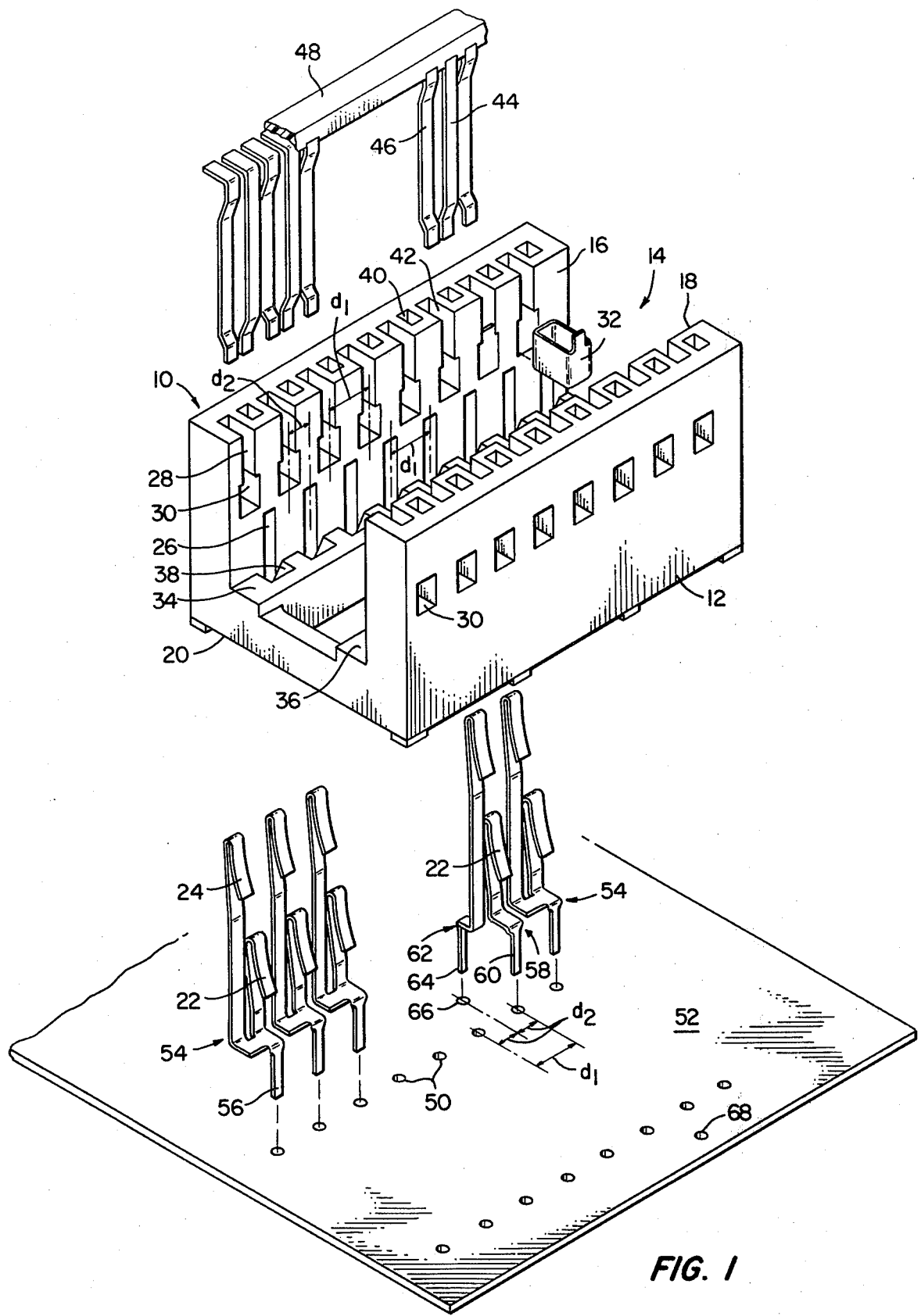
FIG. 1 is an exploded perspective view of an interconnect receptacle in accordance with the invention shown above a PCB for use with the receptacle.
Figure 5:
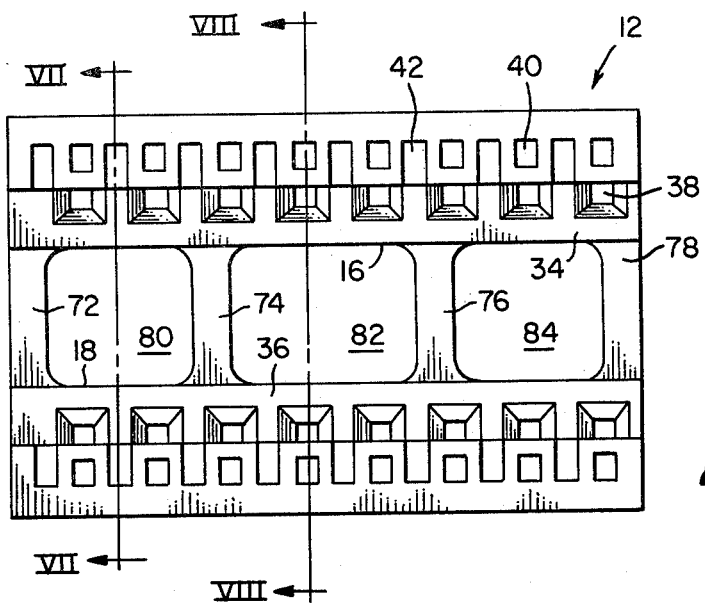
FIG. 5 is a top plan view of the FIG. 4 housing.
Figure 4:
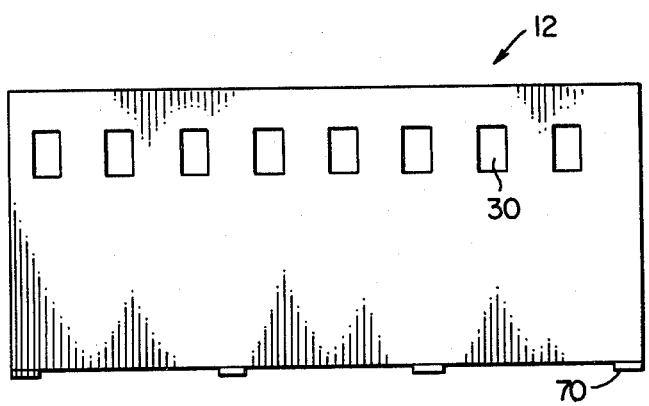
FIG. 4 is a front elevation of the housing of the FIG. 1 receptacle.
Figure 6:
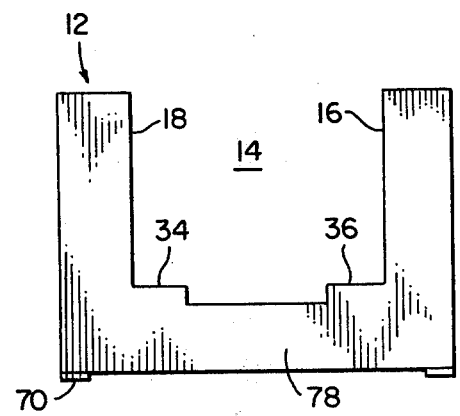
FIG. 6 is a side elevation of the FIG. 4 housing.

Referring to FIG. 1, interconnect receptacle 10 includes housing 12 having elongate channel 14 extending between open ends of the housing and bordered by housing interior sidewalls 16 and 18. The channel is of top-open type to facilitate vertical insertion of electronic packages or components to be stacked within housing 12. Openings are formed in bottom surface 20 of housing 12 for insertion of contacts 22 and 24 respectively into registry with lower contact slots 26 and upper contact slots 28. For purposes discussed in detail below, each upper contact slot has an expanded portion 30 for receiving upper component support insert 32. Lower component support is provided by interior base surfaces 34 and 36. Chamfered guides 38 lead from surfaces 34 and 36 into lower contact slots 26 to guide leads to the lower electronic component into registry with lower contacts 22.

Housing top surface openings 40 and 42 are continuous respectively with lower contact slots 26 and upper contact slots 28. Actuators 44 (lower contact) and 46 (upper contact) are supported in common by plate 48 for respective entry into openings 40 and 42 and vertical movement in slots 26 and 28.

Upper contact slots 28 are uniformly spaced on centers by distance $d_1$ longitudinally along channel 14. Like spacing $d_1$ is provided between centers of lower contact slots 26. A longitudinal offset distance $d_2$ exists between respective centers of each lower slot 26 and each adjacent upper slot 28, spacing $d_2$ being one-half of spacing $d_1$. With spacing $d_1$ also applying between adjacent apertures 50 of printed circuit board 52, the FIG. 1 arrangement provides vertical nonalignment of upper and lower receptacle contacts, while permitting access to both such contacts between successive PCB apertures. To this end, contact configuration 54 supports lower contact 22 jointly with upper contact 24 with center spacing $d_2$ and stem 56 provides PCB connection for both contacts. Contact configuration 58 supports only a lower contact 22 and stem 60 provides PCB connection therefor. Contact configuration 62 differs by supporting only an upper contact 24 and has its stem 64 offset to the opposite side of the contact, all such contact configurations being illustrated in FIGS. 2(a)–2(f) in detail showing these similarities and differences.

Contact configuration 54 is used throughout for collectively bringing to the PCB those package contacts not involved in address/select function. Contact configuration 58 is used to access the lower component received in receptacle 10 and contact configuration 60 is used to access the upper component received in receptacle 10. PCB 52 is complemental to receptacle 10, and vice versa, with quite slight departure from customary PCB geometry for receiving a single DIP. Thus, board apertures 50 may run in two parallel rows with uniform spacing. An additional aperture 66 is formed in the PCB, at longitudinal spacing $d_2$ from adjacent apertures 50, for upper component accessing. In instances where one may look to stacking dynamic components, e.g., where read/write access strokes are needed for each package, a further aperture 68 may be formed outboard of apertures 50 and longitudinally staggered with respect thereto, as in the case of aperture 66. As will be seen, all of apertures 50, 66 and 68 are inboard of the perimenter of receptacle 10 when the PCB and receptacle are assembled.

Figure 7:
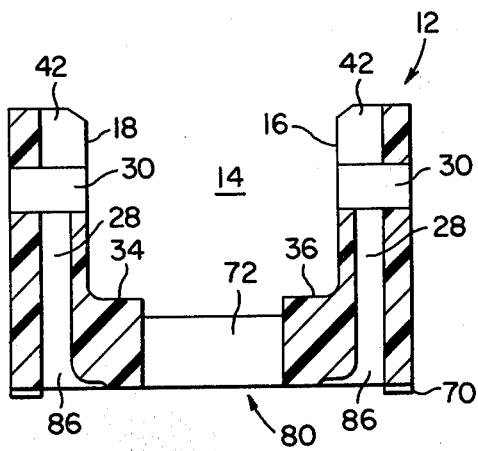
FIG. 7 is a sectional view as seen from plane VII—VII of FIG. 5.
Figure 8:
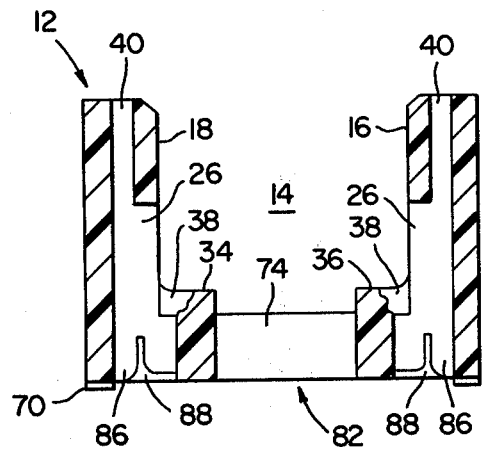
FIG. 8 is a sectional view as seen from plane VIII—VIII of FIG. 5.

Housing interior structural detail is seen in FIGS. 4–8. The housing is upstanding from feet 70 and has transverse base ribs 72–78 extending between interior sidewalls 16 and 18, openings 80–84 existing between the ribs for ventilation of channel 14 and components therein. FIG. 7 shows housing 12 sectionally through upper contact slots 28 and illustrates openings 86 for insertion of contacts. FIG. 8 shows housing 12 sectionally through lower contact slots 26. Openings 86 of FIG. 7 are also seen in FIG. 8, as such openings bridge slots 26 and 28 whereby a contact of configuration 54 of FIG. 2(a) may be inserted with its contacts 22 and 24 seating in slots 26 and 28. Openings 86 likewise permit insertion of contacts of configuration 58 of FIG. 2(c) in slots 26 and contacts of configuration 62 of FIG. 2(e) in slots 28. Contact retainers 88 (FIG. 8) removably secure the contacts in housing 12, the contacts being provided with locking tangs (not shown) for frictional engagement with the retainers and interior housing structure.

Referring to FIGS. 3(a)–3(c), lower contact actuator 44 has a horizontal flange 44a for securement to plate 48 of FIG. 1, a vertical run 44b, a knee 44c, an inclined run 44d and a further vertical run 44e in spaced parallel relation to run 44b. Upper contact actuator 46 has a horizontal flange 46a, a first vertical run 46b, an upper knee 46c, an upper inclined run 46d, a second vertical run 46e, a lower inclined run 46f, a lower knee 46g and a third vertical run 46h. The operation of the actuators upon respective lower and upper contacts will now be discussed in conjunction with FIGS. 9–12.

Figure 10:
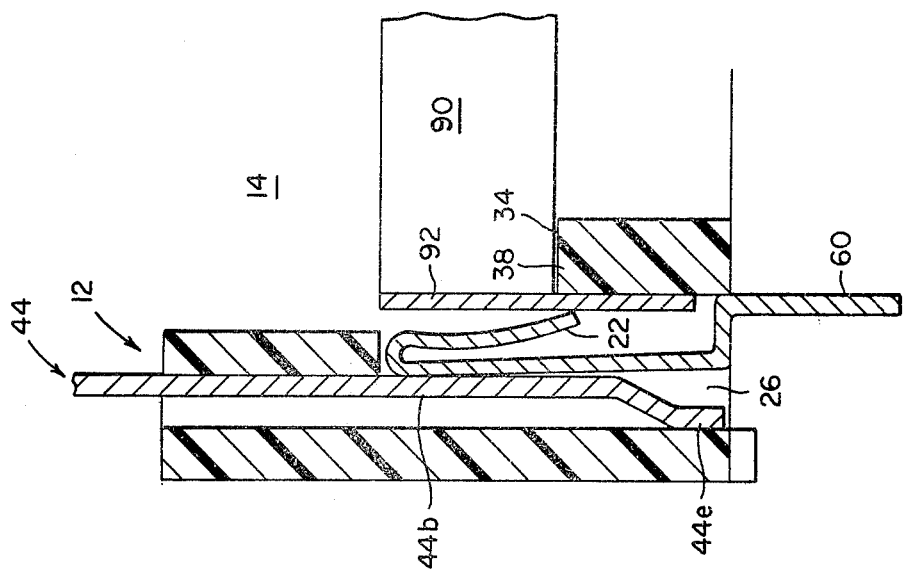
FIGS. 9 and 10 are sectional views illustrating actuator-contact relations for the lower contacts of the FIG. 1 receptacle.
Figure 9:
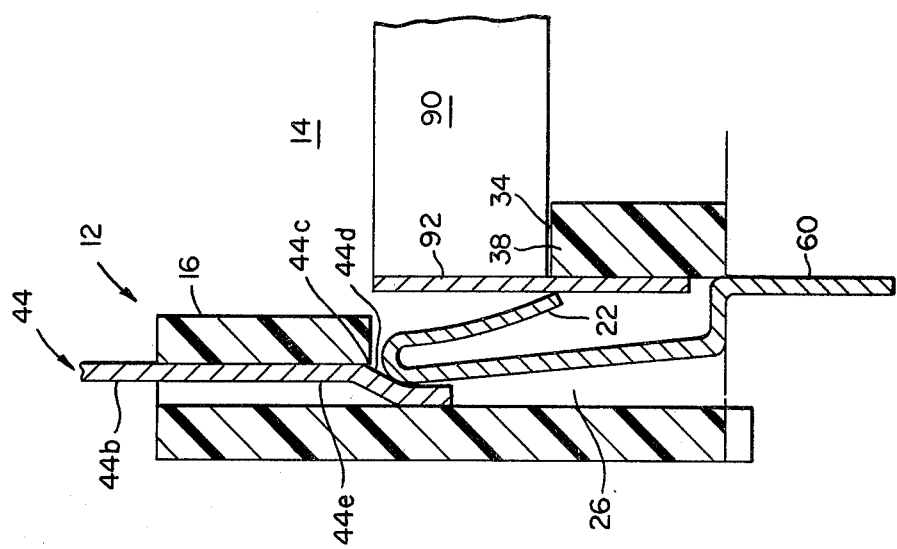

In FIG. 9, lower component package 90 is shown inserted in channel 14 of housing 12 with package contact 92, in dependent leg form as for a DIP, seated in guide 38. Vertical positioning and support for the package is established by support surface 34. In the course of package insertion, actuator 44 is moved vertically upward of its FIG. 9 position, i.e., above and out of engagement with contact 22, whereby the contact is self-biased leftwardly of its FIG. 9 position and insertion of package contact 92 is attained with zero insertion force. In the position of actuator 44 in FIG. 9, following package insertion, contact 22 is forced, by engagement with actuator inclined run 44d, into electrical engagement with package contact 92. In FIG. 10, actuator 44 is in fully inserted position, as will be the case (discussed below) when an upper component package is electrically engaged in the housing and all actuators are fully inserted in the housing. In this FIG. 10 actuator position, contact 22 is engaged by actuator vertical run 44b which is forced rightwardly in slot 26 by reason of housing restraint on spaced vertical run 44e. The inserted extent of package contact 92 is captured against housing extent below surface 34 and guide 38 by contact 22 pressure thereon.

Following insertion of lower component package 90 into housing 12, support inserts 32 (FIG. 11) are to be displaced outwardly of expanded portions 30 of upper contact slots 28 to provide vertical positioning and support for upper component package 94. This may be done, prior to insertion of package 94, by downward movement of actuator 46 from its position shown in FIG. 11. Such movement forces actuator inclined run 46d into slot 28, urging contact 24 leftwardly against wall 32a of insert 32 and displacing the insert outwardly. Insert wall 32b bears against actuator vertical run 46e to precisely measure insert displacement into such position as to underlie package 94 and sit leftwardly of package contact 96 on package insertion. Actuator 46 is now elevated to slightly above its FIG. 11 position whereby contact 24 returns, under self-bias, to noninterfering relation to the zero force insertion path of package contact 96. On package 94 insertion, actuator 46 is moved downwardly through its FIG. 11 position, whereupon contact 24 electrically engages package contact 96, and into its FIG. 12 position. In such fully inserted position, actuator vertical runs 46h bears against the base of contact 24 and its vertical run 46e bears against the rightward slot wall. This disposes actuator knee 46c against contact 24, compressing same against package contact 96.

Referring again to FIG. 1, in assembling receptacle 10, inserts 32 are first placed in expanded portions 30 of upper contact slots 28. Contacts are next inserted through the receptacle bottom surface and inserts 32, contact configuration being preselected in the three diverse varieties in accordance with the nature of the component packages to be received and PCB connections desired. On insertion of the actuators, the receptacle is readied for package insertion.

Figure 12:
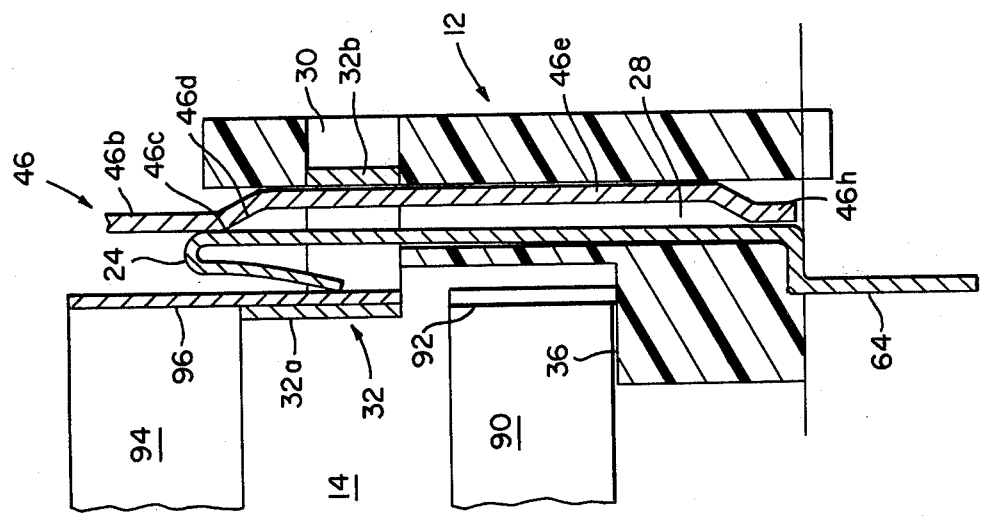
FIGS. 11 and 12 are sectional views illustrating actuator-contact relations for the upper contacts of the FIG. 1 receptacle.
Figure 11:
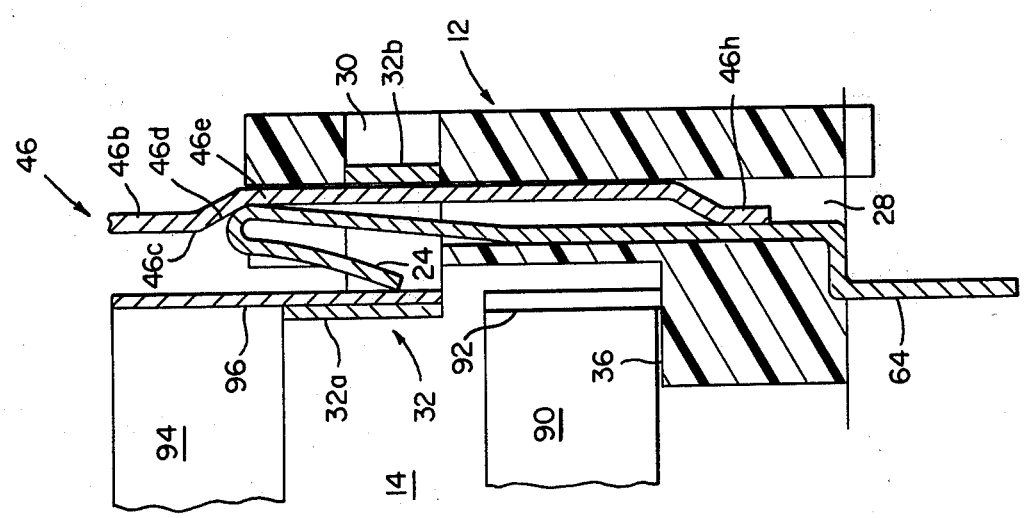

Based on the difference in configurations of actuators 44 and 46, upper package removal and substitution may be made at any time without interrupting electrical continuity between the lower package and the PCB. As will also be seen, the receptacle structure is highly ventilated as its ends and top are fully open and its base is largely open. As depicted in FIGS. 11 and 12, vertical spacing is prescribed as between inserted packages 90 and 94, channel 14 remaining fully open in such interpackage volume. Connection to PCB is readily made without packages inserted, thus isolating the packages from soldering heat and the like. As noted above, desired zero insertion force is afforded by selective actuator positioning.

The receptacle housing is preferably comprised of molded plastic. The actuators and upper package support inserts may also be of rigid synthetic matter, but are preferably metal. Contacts may be noble metal-plated, based on zero insertion force.

By way of summary, the invention may be considered in several aspects. In providing zero insertion force receipt and support of packages, the receptacle housing is upstanding and has vertically spaced contacts which are disposed in noninterfering disposition to the housing package-receiving channel and are actuator-displacable from such disposition into engagement with the package contacts. In a package stacking aspect, the invention includes fixed support surface for supporting a first-received package and other support surface for a second-received package, such other support surface being movable in the housing from noninterfering disposition with respect to the channel, permitting first package insertion, to residence disposition in the channel. In its aspect for providing ready accessing of each of plural stacked packages, the invention disposes vertically spaced pluralities of contacts longitudinally of an elongate package receiving channel with mutually offset longitudinal relation between the contact pluralities providing vertical nonalignment of contacts.

Various modifications to the foregoing particularly set forth embodiment of the invention will now be evident to those skilled in the art. Accordingly, such preferred embodiment and the foregoing discussion thereof is intended in an illustrative and not in a limiting sense. The true spirt and scope of the invention is set forth in the following claims.

We claim:

1. A receptacle for supporting electronic packages in stacked relation and providing electrical connection to contacts of said packages, comprising:
   an upstanding housing defining a channel for receipt of said packages and supporting such received packages in vertically spaced relation in said channel;
   contact means supported in said housing in vertically spaced relation and in noninterfering disposition with respect to said channel; and
   actuator means movably supported in said housing for displacing said contact means from such noninterfering disposition with respect to said channel into engagement with said contacts of said received packages.

2. The receptacle claimed in claim 1 wherein said contact means are self-biased into said noninterfering disposition and wherein said actuator means is supported in said housing for movement into engagement with said contact means.

3. The receptacle claimed in claim 1 wherein said contact means comprises first and second pluralities of respectively vertically spaced receptacle contacts.

4. The receptacle claimed in claim 3 wherein said channel is elongate and wherein said second receptacle contacts are offset with respect to said first receptacle contacts longitudinally of said channel.

5. The receptacle claimed in claim 4 wherein adjacent ones of said first receptacle contacts are spaced longitudinally by a first spacing distance, wherein adjacent ones of said second receptacle contacts are spaced longitudinally by said first spacing distance and wherein said offset is a second spacing equal to one-half of said first spacing.

6. The receptacle claimed in claim 1 wherein said housing defines fixed support means for the lowermost of such received packages and other support means vertically spaced from said fixed support means for another such received package, said other support means being movable in said housing from noninterfering disposition with respect to said channel to disposition in said channel.

7. The receptacle claimed in claim 3 wherein said housing includes at least one first contact stem extending outwardly of said housing and connected to an exclusive one of said first receptacle contacts.

8. The receptacle claimed in claim 7 wherein said housing includes at least one second contact stem extending outwardly of said housing and connected to an exclusive one of said second receptacle contacts.

9. The receptacle claimed in claim 3 wherein said housing includes a plurality of contact stems extending outwardly of said housing, each connected in common to a first and a second receptacle contact.

10. The receptacle claimed in claim 8 wherein said housing includes a plurality of third contact stems extending outwardly of said housing, each connected to a first and a second receptacle contact.

11. A receptacle for supporting electronic packages in stacked relation and providing electrical connection to contacts of said packages, comprising:
    an upstanding housing defining a channel for receiving said packages and fixed support means for supporting the lowermost of such received packages;
    movable package support means disposed in said housing for movement from noninterfering disposition with respect to said channel into residence disposition in said channel vertically above such inserted lowermost package for engagingly supporting a further package received in said channel; and
    contact means supported in said housing in vertically spaced relation for engagement with said contacts of said received packages.

12. The receptacle claimed in claim 11 wherein said contact means are supported in said housing in noninterfering disposition with respect to said channel, said receptacle further comprising actuator means movably supported in said housing for displacing said contact means from said noninterfering disposition with respect to said channel into engagement with said contacts of said received packages.

13. The receptacle claimed in claim 12 wherein said contact means are self-biased into said noninterfering disposition and wherein said actuator means is supported in said housing for movement into engagement with said contact means.

14. The receptacle claimed in claim 11 wherein said contact means comprises first and second pluralities of respectively vertically spaced receptacle contacts.

15. The receptacle claimed in claim 14 wherein said channel is elongate and wherein said second receptacle contacts are offset with respect to said first receptacle contacts longitudinally of said channel.

16. The receptacle claimed in claim 15 wherein adjacent ones of said first receptacle contacts are spaced longitudinally by a first spacing distance, wherein adjacent ones of said second receptacle contacts are spaced longitudinally by said first spacing distance and wherein said offset is a spacing equal to one-half of said first spacing.

17. The receptacle claimed in claim 14 wherein said housing includes at least one first contact stem extending outwardly of said housing and connected to an exclusive one of said first receptacle contacts.

18. The receptacle claimed in claim 17 wherein said housing includes at least one second contact stem extending outwardly of said housing and connected to an exclusive one of said second receptacle contacts.

19. The receptacle claimed in claim 14 wherein said housing includes a plurality of contact stems extending outwardly of said housing, each connected in common to a first and a second receptacle contact.

20. The receptacle claimed in claim 18 wherein said housing includes a plurality of third contact stems extending outwardly of said housing, each connected to a first and a second receptacle contact.

21. A receptacle for supporting electronic packages in stacked relation and providing electrical connection to contacts of said packages, comprising:
an upstanding housing defining an elongate channel for receiving said packages and supporting such received packages in vertically spaced relation in said channel; and
contact means for engaging said contacts of said received packages including a plurality of first receptacle contacts spaced longitudinally of said channel and a plurality of second receptacle contacts spaced longitudinally of said channel, said housing supporting said second receptacle contacts in longitudinally offset relation to said first receptacle contacts and vertically spaced therefrom.

22. The receptacle claimed in claim 21 wherein said contact means are supported in said housing in noninterfering disposition with respect to said channel, said receptacle further comprising actuator means movably supported in said housing for displacing said contact means from said noninterfering disposition with respect to said channel into engagement with said contacts of said received packages.

23. The receptacle claimed in claim 22 wherein said contact means are self-biased into said noninterfering disposition and wherein said actuator means is supported in said housing for movement into engagement with said contact means.

24. The receptacle claimed in claim 21 wherein adjacent ones of said first receptacle contacts are spaced longitudinally by a first spacing distance, wherein adjacent ones of said second receptacle contacts are spaced longitudinally by said first spacing distance and wherein said offset is a second spacing equal to one-half of said first spacing.

25. The receptacle claimed in claim 21 wherein said housing defines fixed support means for the lowermost of such received packages and other support means vertically spaced from said fixed support means for another such received package, said other support means being movable in said housing from noninterfering disposition with respect to said channel to disposition in said channel.

26. The receptacle claimed in claim 21 wherein said housing includes at least one first contact stem extending outwardly of said housing and connected to an exclusive one of said first receptacle contacts.

27. The receptacle claimed in claim 26 wherein said housing includes at least one second contact stem extending outwardly of said housing and connected to an exclusive one of said second receptacle contacts.

28. The receptacle claimed in claim 21 wherein said housing includes a plurality of contact stems extending outwardly of said housing, each connected in common to a first and a second receptacle contact.

29. The receptacle claimed in claim 27 wherein said housing includes a plurality of third contact stems extending outwardly of said housing, each connected to a first and a second receptacle contact.

* * * * *